(12) United States Patent
Murakoshi et al.

(10) Patent No.: US 9,741,730 B2
(45) Date of Patent: Aug. 22, 2017

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Atsushi Murakoshi, Mie (JP); Kazuhito Furumoto, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/061,470

(22) Filed: Mar. 4, 2016

(65) Prior Publication Data

US 2017/0077112 A1 Mar. 16, 2017

(30) Foreign Application Priority Data

Sep. 10, 2015 (JP) .................. 2015-178160

(51) Int. Cl.
| | |
|---|---|
| *H01L 27/11* | (2006.01) |
| *H01L 27/11524* | (2017.01) |
| *H01L 29/788* | (2006.01) |
| *H01L 29/66* | (2006.01) |
| *H01L 29/423* | (2006.01) |
| *H01L 21/28* | (2006.01) |

(52) U.S. Cl.
CPC .. *H01L 27/11524* (2013.01); *H01L 21/28273* (2013.01); *H01L 29/42328* (2013.01); *H01L 29/66825* (2013.01); *H01L 29/788* (2013.01)

(58) Field of Classification Search
CPC .............................................. H01L 27/11524
See application file for complete search history.

(56) References Cited

U.S. PATENT DOCUMENTS

| | | | | |
|---|---|---|---|---|
| 5,194,924 | A | * 3/1993 | Komori | ............ H01L 21/28273 257/316 |
| 6,479,862 | B1 | * 11/2002 | King | ................ H01L 29/42332 257/295 |
| 8,541,830 | B1 | * 9/2013 | Nagashima | ........... H01L 27/088 257/315 |
| 2003/0143790 | A1 | * 7/2003 | Wu | ................... H01L 27/11521 438/197 |
| 2003/0203594 | A1 | * 10/2003 | Shimizu | ........... H01L 27/11521 438/424 |

(Continued)

FOREIGN PATENT DOCUMENTS

| | | |
|---|---|---|
| JP | 10-289958 | 10/1998 |
| JP | 2009-283852 | 12/2009 |

*Primary Examiner* — Evren Seven
*Assistant Examiner* — S. M. S Imtiaz
(74) *Attorney, Agent, or Firm* — Finnegan, Henderson, Farabow, Garrett & Dunner, L.L.P.

(57) ABSTRACT

According to one embodiment, the first separation film separates the control electrode, the first insulating layer, the charge storage layer, the intermediate insulating layer, the floating electrode layer, and the second insulating layer in a first direction. The second separation film separates a first stacked unit in a second direction. The first stacked unit includes the charge storage layer, the intermediate insulating layer, the floating electrode layer, the second insulating layer, and the semiconductor layer. The second direction intersects the first direction. The second separation film contains silicon.

17 Claims, 16 Drawing Sheets

(56) References Cited

U.S. PATENT DOCUMENTS

| | | | |
|---|---|---|---|
| 2004/0069990 A1* | 4/2004 | Mahajani | H01L 21/84 257/66 |
| 2005/0056895 A1* | 3/2005 | Shimizu | H01L 27/11521 257/355 |
| 2008/0012060 A1* | 1/2008 | Ding | H01L 21/28282 257/314 |
| 2009/0001451 A1* | 1/2009 | Lee | H01L 27/11524 257/326 |
| 2010/0102377 A1* | 4/2010 | Iikawa | H01L 21/76224 257/324 |
| 2010/0181612 A1* | 7/2010 | Kito | H01L 27/11551 257/319 |
| 2011/0291174 A1* | 12/2011 | Ooike | H01L 21/76224 257/316 |
| 2012/0104485 A1* | 5/2012 | Yang | H01L 21/764 257/324 |
| 2012/0139030 A1* | 6/2012 | Sakuma | H01L 21/28273 257/326 |
| 2012/0217571 A1* | 8/2012 | Arai | H01L 29/66825 257/324 |
| 2012/0241872 A1* | 9/2012 | Endo | H01L 27/11531 257/408 |
| 2013/0234097 A1* | 9/2013 | Fujii | H01L 45/085 257/4 |
| 2014/0225179 A1* | 8/2014 | Aoyama | H01L 29/792 257/316 |
| 2016/0293618 A1* | 10/2016 | Namkoong | H01L 27/11568 |
| 2016/0300865 A1* | 10/2016 | Yamazaki | H01L 27/1266 |

* cited by examiner

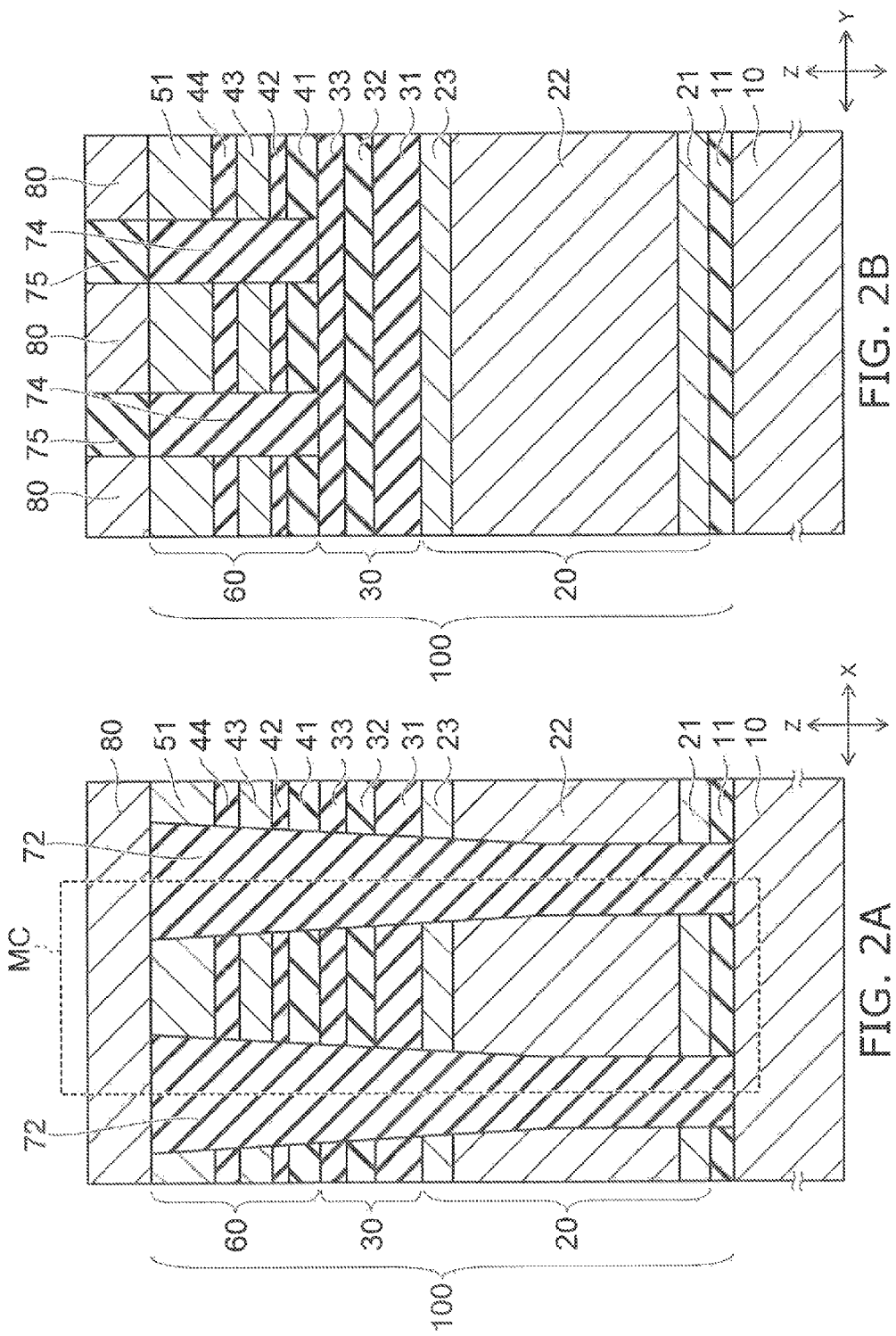

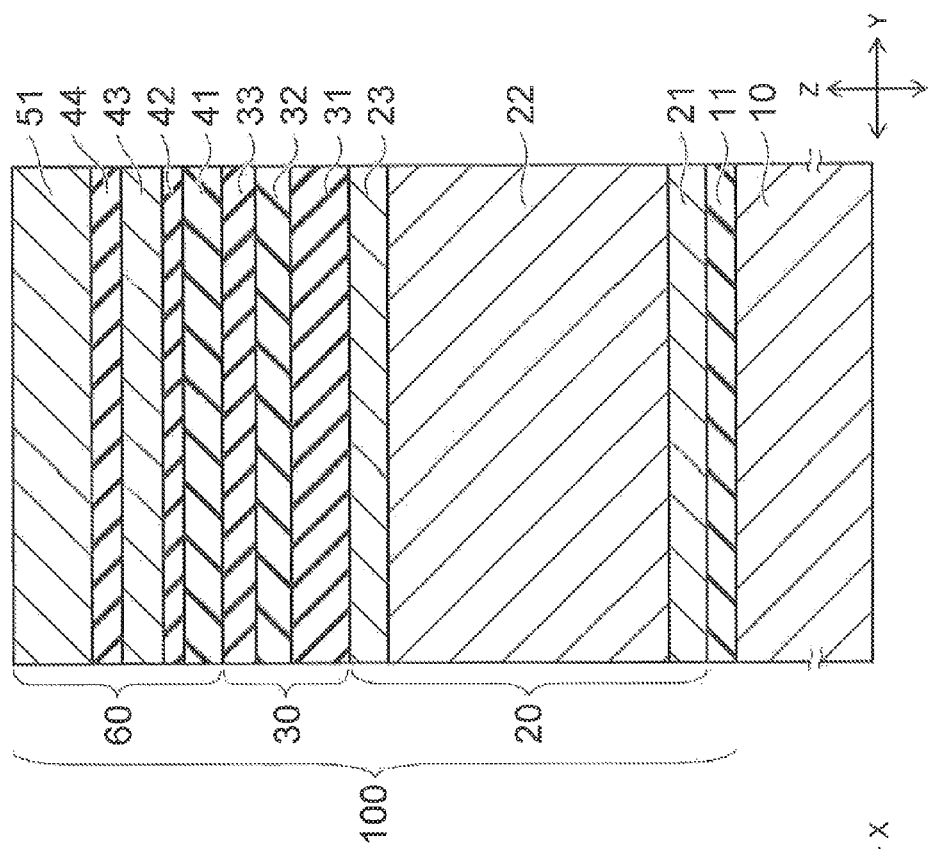
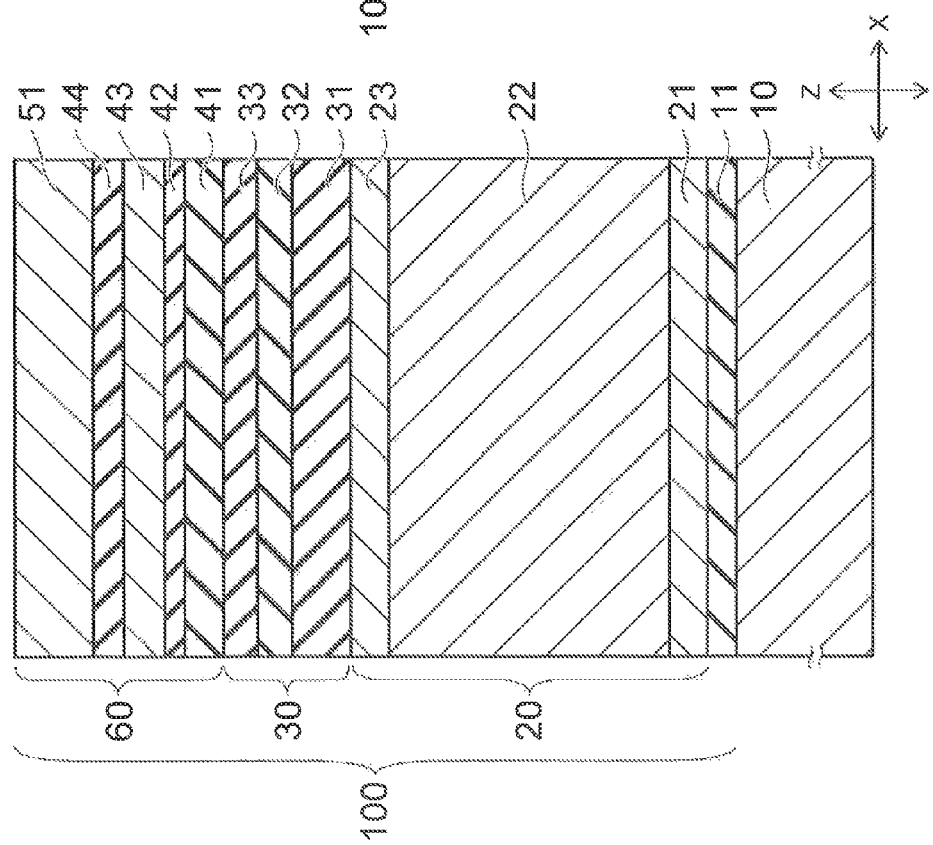

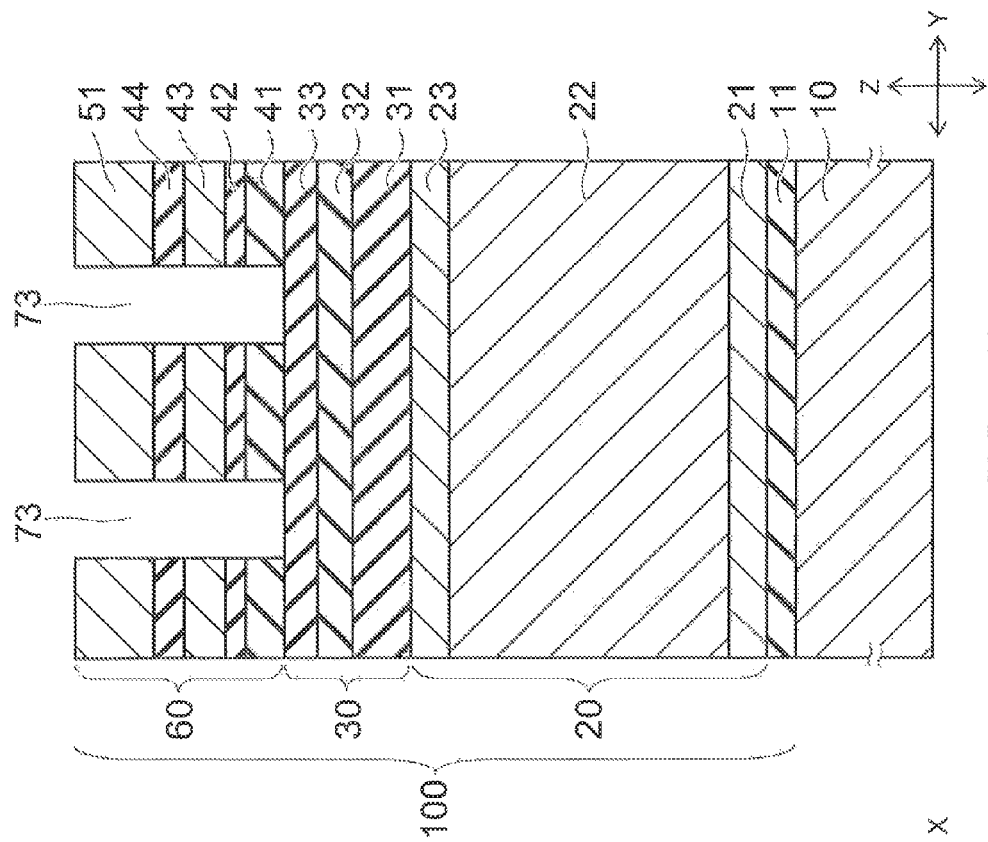
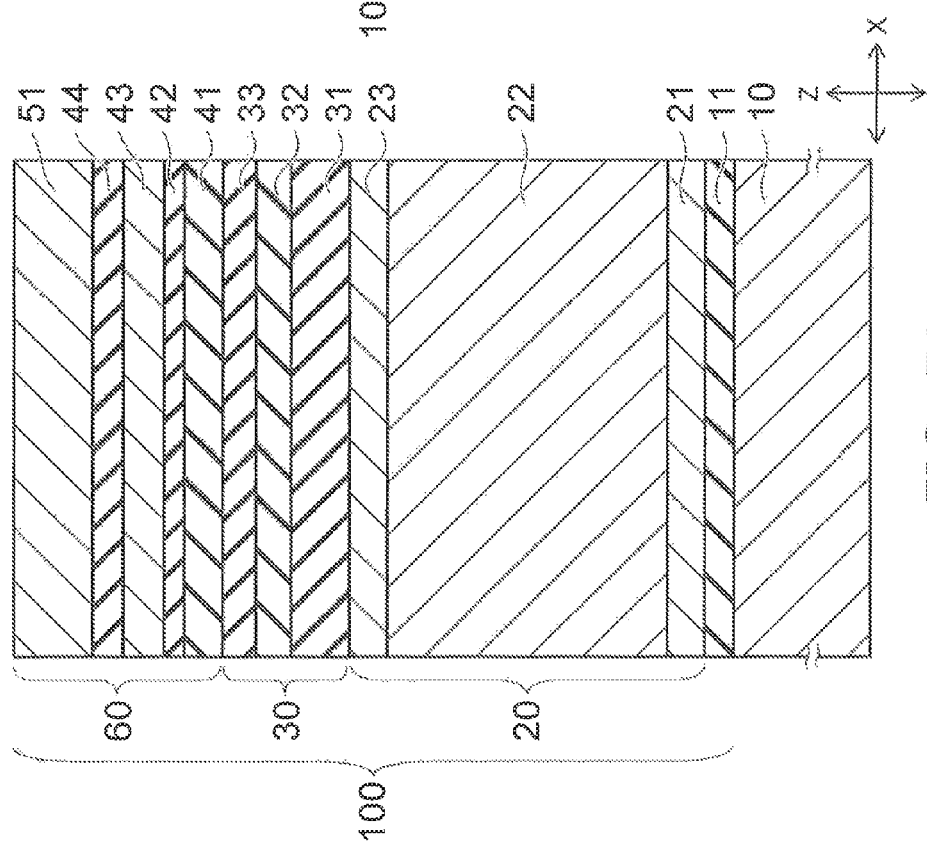

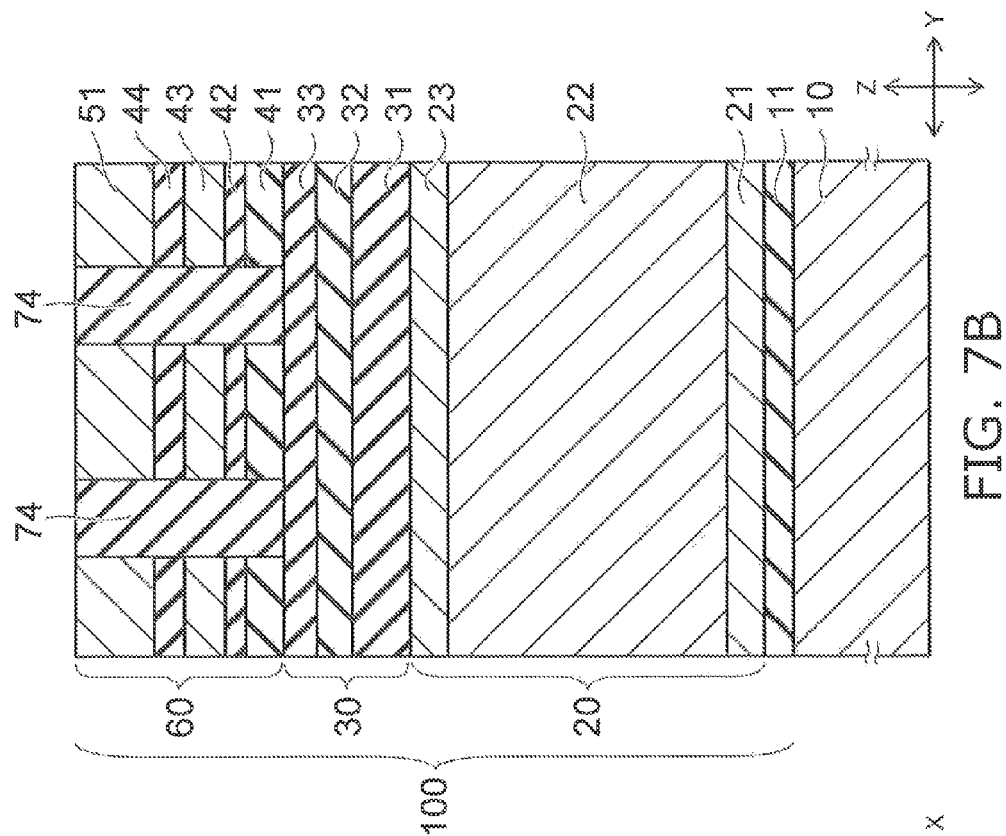
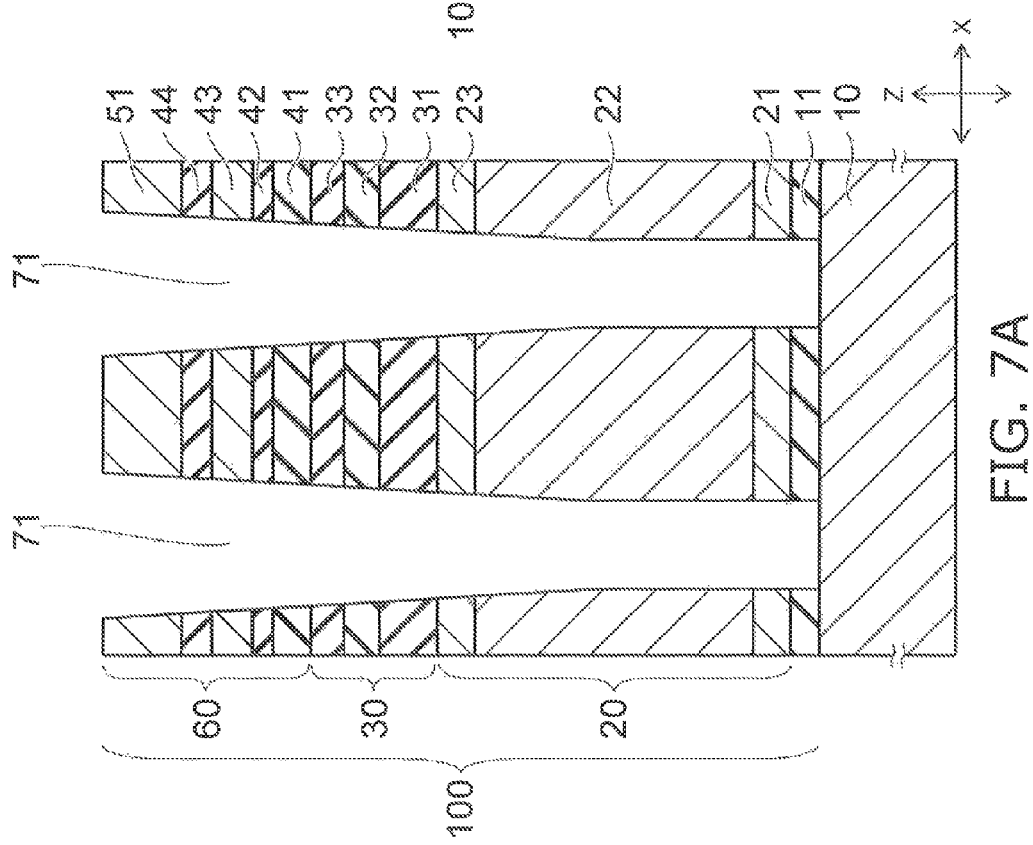

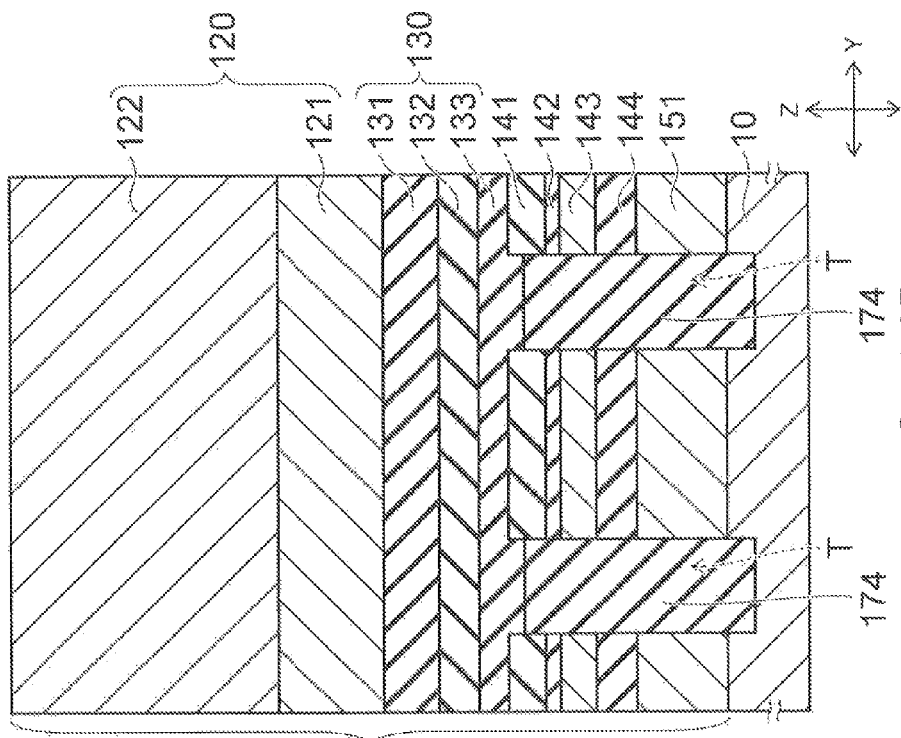
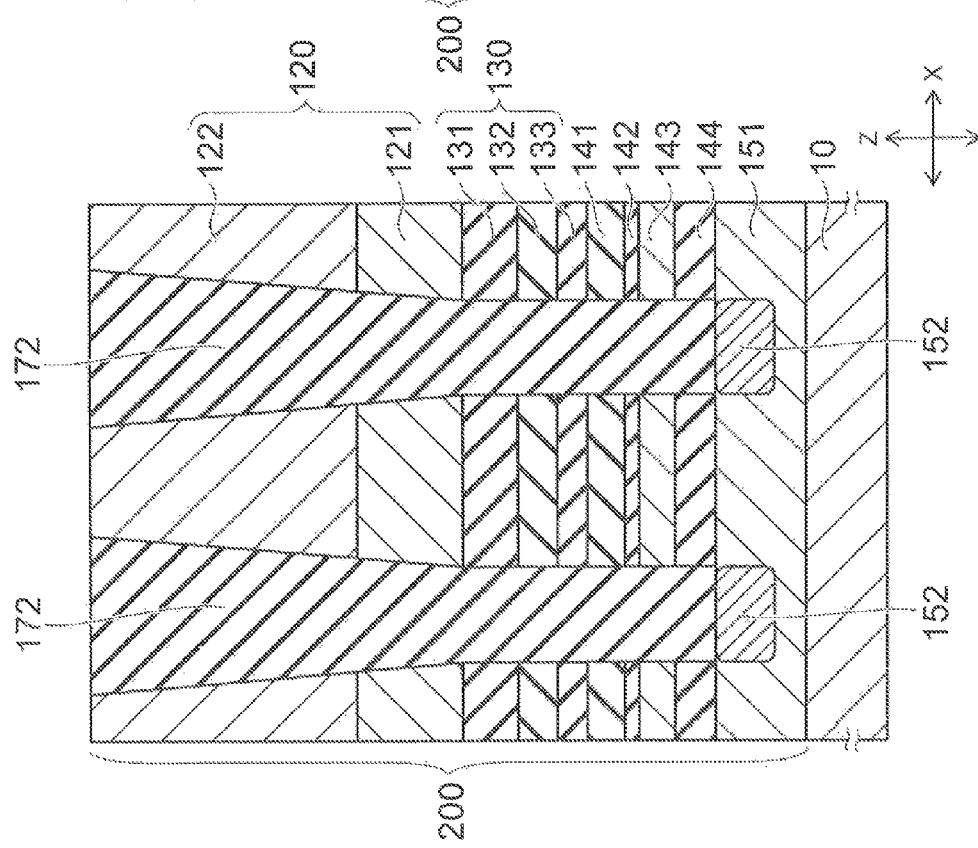
FIG. 14A
FIG. 14B

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-178160, filed on Sep. 10, 2015; the entire contents of which are incorporated herein by reference.

FIELD

Embodiments described herein relate generally to a semiconductor device and a method for manufacturing the same.

BACKGROUND

A memory device has been proposed in which a metal oxide film having a high dielectric constant is used as an insulating film. The electrical characteristics of the metal oxide film having the high dielectric constant may fluctuate due to an absorption reaction of silicon.

BRIEF DESCRIPTION OF THE DRAWINGS

FIG. 2A is an A-A cross-sectional view of FIG. 1;

FIG. 2B is a B-B cross-sectional view of FIG. 1;

FIGS. 3A to 7B are schematic cross-sectional views showing a method for manufacturing the semiconductor device of the embodiment;

FIGS. 14A and 14B are schematic cross-sectional views of a semiconductor device of a comparative example;

DETAILED DESCRIPTION

Figure 1:
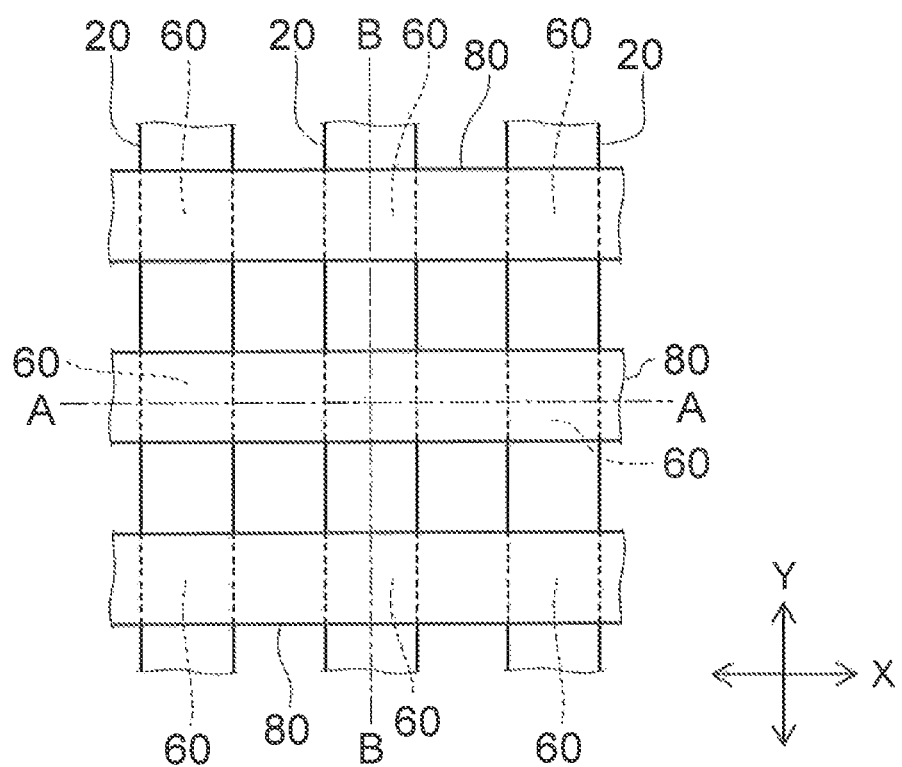
FIG. 1 is a schematic plan view of some of the components of a semiconductor device of an embodiment.

According to one embodiment, a semiconductor device includes a control electrode extending a first direction, a first insulating layer provided on the control electrode, the first insulating layer containing a metal oxide, a charge storage layer provided on the first insulating layer, an intermediate insulating layer provided on the charge storage layer, a floating electrode layer provided on the intermediate insulating layer, a second insulating layer provided on the floating electrode layer, a semiconductor layer provided on the second insulating layer, a first separation film, and a second separation film. The first separation film separates the control electrode, the first insulating layer, the charge storage layer, the intermediate insulating layer, the floating electrode layer, and the second insulating layer in the first direction. The second separation film separates a first stacked unit in a second direction. The first stacked unit includes the charge storage layer, the intermediate insulating layer, the floating electrode layer, the second insulating layer, and the semiconductor layer. The second direction intersects the first direction. The second separation film contains silicon.

Embodiments will now be described with reference to the drawings. The same components are marked with the same reference numerals in the drawings.

FIG. 1 is a schematic plan view of some of the components of a semiconductor device of an embodiment.

FIG. 2A is an A-A cross-sectional view of FIG. 1; and FIG. 2B is a B-B cross-sectional view of FIG. 1.

As shown in FIGS. 2A and 2B, the semiconductor device of the embodiment includes a substrate 10, and a stacked body 100 provided on the substrate 10. The substrate 10 is a semiconductor substrate, e.g., a silicon substrate.

Two mutually-orthogonal directions parallel to a major surface of the substrate 10 are taken as an X-direction (a first direction) and a Y-direction (a second direction) in the plan view of FIG. 1; and a direction orthogonal to both the X-direction and the Y-direction is taken as a Z-direction (a third direction or a stacking direction) shown in FIGS. 2A and 2B.

The stacked body 100 includes an insulating layer (a third insulating layer) 11, a control electrode 20, a blocking insulating layer (a first insulating layer) 30, and a first stacked unit 60. The first stacked unit 60 includes a charge storage layer 41, an intermediate insulating layer 42, a floating electrode layer 43, a tunneling insulating layer (a second insulating layer) 44, and a semiconductor layer 51.

The insulating layer 11 is provided on the major surface of the substrate 10 and is, for example, a silicon oxide layer. The control electrode 20 is provided on the insulating layer 11.

The control electrode 20 includes a first electrode layer 21, a second electrode layer 22, and a third electrode layer 23. The first electrode layer 21 is provided on the insulating layer 11. The second electrode layer 22 is provided on the first electrode layer 21. The third electrode layer 23 is provided on the second electrode layer 22.

The first electrode layer 21 and the third electrode layer 23 are, for example, tungsten nitride layers. The second electrode layer 22 is, for example, a tungsten layer. The thickness of the second electrode layer 22 is thicker than the thickness of the first electrode layer 21 and the thickness of the third electrode layer 23.

The blocking insulating layer 30 is provided on the third electrode layer 23. The blocking insulating layer 30 includes a first blocking layer 31, a second blocking layer 32, and a third blocking layer 33. The first blocking layer 31 is provided on the third electrode layer 23. The second blocking layer 32 is provided on the first blocking layer 31. The third blocking layer 33 is provided on the second blocking layer 32.

The first blocking layer 31, the second blocking layer 32, and the third blocking layer 33 include, for example, a metal oxide of at least one of aluminum (Al), hafnium (Hf), tantalum (Ta), zirconium (Zr), or lanthanum (La). The dielectric constants of the first blocking layer 31, the second blocking layer 32, and the third blocking layer 33 are, for example, 9 or more.

For example, the first blocking layer 31 is a tantalum oxide layer; the second blocking layer 32 is a hafnium oxide layer; and the third blocking layer 33 is an aluminum oxide layer.

The charge storage layer 41 is provided on the third blocking layer 33. The charge storage layer 41 includes a metal oxide and is, for example, a hafnium oxide layer.

The intermediate insulating layer 42 is provided on the charge storage layer 41. The intermediate insulating layer 42 is, for example, a silicon nitride layer.

The floating electrode layer 43 is provided on the intermediate insulating layer 42. The floating electrode layer 43 is, for example, a silicon layer.

The tunneling insulating layer 44 is provided on the floating electrode layer 43. The tunneling insulating layer 44 is, for example, a silicon oxide layer.

The semiconductor layer 51 is provided on the tunneling insulating layer 44. The semiconductor layer 51 is, for example, a silicon layer including silicon as a major component. As described below, the semiconductor layer 51 includes a p-type impurity that is the supply source of holes, and an n-type impurity that is the supply source of free electrons.

As shown in FIG. 2A, the stacked body 100 that is on the substrate 10 is separated in the X-direction by a first separation film 72. The first separation film 72 extends in the stacking direction (the Z-direction) through the stacked body 100 and extends into the page surface (the Y-direction) in FIG. 2A. The first separation film 72 is, for example, an insulating film including silicon oxide, silicon nitride, or silicon oxynitride.

As shown in FIG. 2B, the first stacked unit 60 that includes the charge storage layer 41, the intermediate insulating layer 42, the floating electrode layer 43, the tunneling insulating layer 44, and the semiconductor layer 51 is separated in the Y-direction by a second separation film 74.

The second separation film 74 is, for example, a cured body of polysilazane and is an insulating film. Polysilazane is an inorganic polymer that is soluble in an organic solvent having —(SiH$_2$NH)— as the basic unit.

The first stacked unit 60 is separated in the X-direction and the Y-direction by the first separation film 72 and the second separation film 74. As shown in FIG. 1, the multiple first stacked units 60 that are separated in the X-direction and the Y-direction are arranged in the X-direction and the Y-direction in, for example, a matrix configuration. The periphery of one first stacked unit 60 is surrounded with an insulator (the first separation film 72 and the second separation film 74).

As shown in FIG. 2A, an interconnect layer 80 (a second semiconductor layer) is provided on the semiconductor layer 51 and on the first separation film 72. The interconnect layer 80 contacts the semiconductor layer 51 and is electrically connected to the semiconductor layer 51. The interconnect layer 80 is, for example, a silicon layer doped with an impurity. For example, an n-p-n junction is formed between the semiconductor layer 51 and the interconnect layer 80 for each memory cell MC.

As shown in FIG. 1, the multiple interconnect layers 80 are arranged to be separated from each other in the Y-direction; and each of the interconnect layers 80 extends in the X-direction. As shown in FIG. 2B, an insulating film 75 (the second separation film) is provided on the second separation film 74 between the multiple interconnect layers 80. The multiple semiconductor layers 51 that are arranged in the X-direction are connected to a common interconnect layer 80 extending in the X-direction.

The control electrode 20 is separated in the X-direction by the first separation film 72 shown in FIG. 2A. As shown in FIG. 1, the control electrode 20 extends in the Y-direction. The first stacked unit 60 that includes the charge storage layer 41 is provided at the cross point between the interconnect layer 80 extending in the X-direction and the control electrode 20 extending in the Y-direction.

The components surrounded with the broken line in FIG. 2A are included in one memory cell MC. The control electrode and the blocking insulating layer 30 of the memory cell MC are separated in the X-direction by the first separation film 72 and extend into the page surface of FIG. 2A (the Y-direction shown in FIG. 2B). As described above, the first stacked unit 60 of the memory cell MC is separated in the X-direction and the Y-direction by the first separation film 72 and the second separation film 74.

Any memory cell MC can be selected by selecting the interconnect layer 80 and the control electrode 20 that are the object of the potential control. The interconnect layer 80 applies a potential to the semiconductor layer 51 that functions as the channel of the memory cell MC.

The charge storage layer 41 has many trapping sites of charge and functions as a data storage layer that stores the charge injected from the semiconductor layer 51. When relatively setting the semiconductor layer 51 to a low potential and the control electrode 20 to a high potential, electrons from the semiconductor layer 51 are injected into the charge storage layer 41; and the programming of the data is executed. When relatively setting the semiconductor layer 51 to a high potential and the control electrode 20 to a low potential, holes are injected from the semiconductor layer 51 into the charge storage layer 41 or electrons are removed from the charge storage layer 41 by the semiconductor layer 51; and data is erased.

The semiconductor device of the embodiment is a nonvolatile semiconductor memory device that can freely and electrically erase/program data and can retain the memory content even when the power supply is OFF.

The tunneling insulating layer 44 is used as a potential barrier when the charge is injected from the semiconductor layer 51 into the charge storage layer 41 or when the charge stored in the charge storage layer 41 is discharged into the semiconductor layer 51.

The blocking insulating layer 30 prevents the charge stored in the charge storage layer 41 from being discharged into the control electrode 20. As described above, the blocking insulating layer 30 is a stacked film of the layers 31 to 33 having dielectric constants of 9 or more. The blocking insulating layer 30 that has such a high dielectric constant realizes a low leakage current at a high breakdown voltage.

The intermediate insulating layer 42 forms a potential barrier that prevents the charge stored in the charge storage layer 41 from returning to the semiconductor layer 51 side.

An interface state that can trap the charge occurs at the interface between the tunneling insulating layer 44 which is a silicon oxide layer and the intermediate insulating layer 42 which is a silicon nitride layer. Therefore, the floating electrode layer 43 which is a silicon layer is provided between the tunneling insulating layer 44 and the intermediate insulating layer 42.

An interface state that can trap charge occurs at the interface between the blocking insulating layer 30 having the high dielectric constant and the floating electrode layer 43 which is a silicon layer. Therefore, the intermediate insulating layer 42 which is a silicon nitride layer is provided between the floating electrode layer 43 and the blocking insulating layer 30.

A method for manufacturing the semiconductor device of the embodiment will now be described with reference to FIG. 3A to FIG. 7B.

FIG. 3A, FIG. 4A, FIG. 5A, FIG. 6A, and FIG. 7A correspond to an X-Z cross section shown in FIG. 2A.

FIG. 3B, FIG. 4B, FIG. 5B, FIG. 6B, and FIG. 7B correspond to a Y-Z cross section shown in FIG. 2B.

Figure 3A:
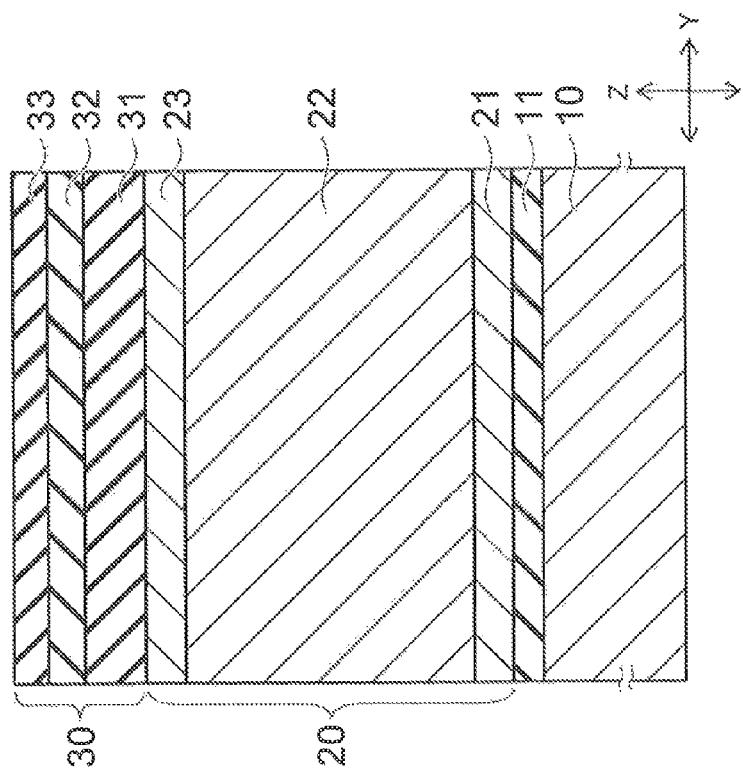
Figure 3B:
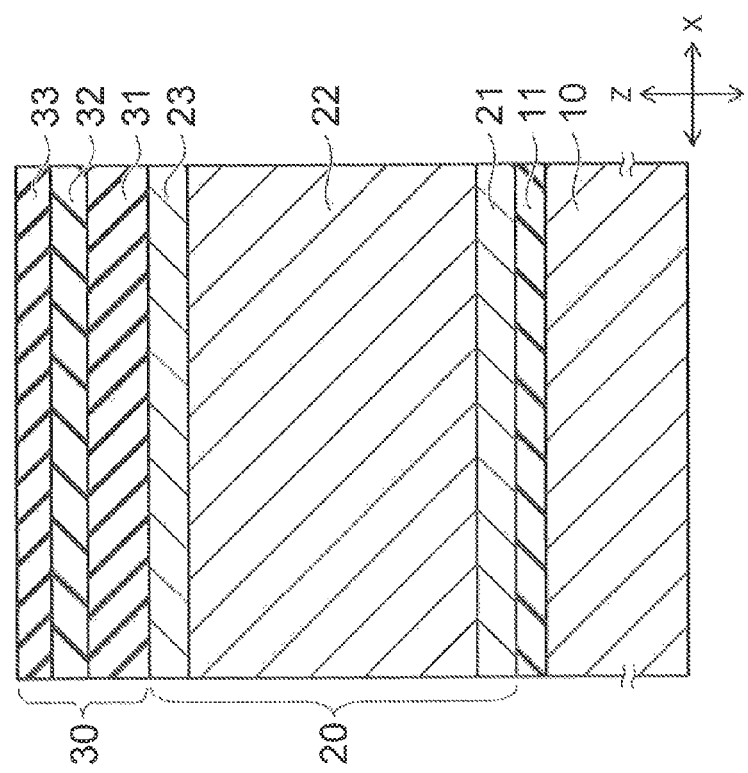

As shown in FIGS. 3A and 3B, the insulating layer 11 is formed on the substrate 10; the control electrode 20 is formed on the insulating layer 11; and the blocking insulating layer 30 is formed on the control electrode 20.

The substrate 10 is a silicon substrate; and the insulating layer 11 is a silicon oxide layer. For example, the insulating layer 11 is formed by thermal oxidation or CVD (Chemical Vapor Deposition). The insulating layer 11 may be a silicon nitride layer. The insulating layer 11 insulates between the substrate and the control electrode 20.

The control electrode 20 includes the first electrode layer 21 that is formed on the insulating layer 11, the second electrode layer 22 that is formed on the first electrode layer 21, and the third electrode layer 23 that is formed on the second electrode layer 22. The first electrode layer 21 and the third electrode layer 23 are, for example, tungsten nitride layers. The second electrode layer 22 is, for example, a tungsten layer.

The insulating layer 11 suppresses tungsten whiskers or tungsten silicide whiskers formed by reactions between the silicon of the substrate 10 and the tungsten of the control electrode 20.

The first electrode layer 21 and the third electrode layer 23 which are nitrides of tungsten suppress the tungsten whiskers or the tungsten silicide whiskers.

The blocking insulating layer 30 includes the first blocking layer 31 that is formed on the third electrode layer 23, the second blocking layer 32 that is formed on the first blocking layer 31, and the third blocking layer 33 that is formed on the second blocking layer 32.

For example, a tantalum oxide layer is formed as the first blocking layer 31 on the third electrode layer 23. After the tantalum oxide layer is formed, the tantalum oxide layer is cured and crystallized by heat treatment. Continuing, for example, a hafnium oxide layer is formed as the second blocking layer 32 on the first blocking layer 31. After the hafnium oxide layer is formed, the hafnium oxide layer is cured and crystallized by heat treatment. Continuing, for example, an aluminum oxide layer is formed as the third blocking layer 33 on the second blocking layer 32. After the aluminum oxide layer is formed, the aluminum oxide layer is cured and crystallized by heat treatment.

According to the embodiment, the blocking insulating layer 30 does not absorb silicon in the heat treatment for curing the blocking insulating layer 30 including the metal oxide because the blocking insulating layer 30 does not contact the film including silicon.

Then, as shown in FIGS. 4A and 4B, for example, a hafnium oxide layer is formed as the charge storage layer 41 on the third blocking layer 33. After the hafnium oxide layer is formed, the hafnium oxide layer is cured and crystallized by heat treatment.

For example, the silicon nitride layer is formed as the intermediate insulating layer 42 on the charge storage layer 41. For example, a polycrystalline silicon layer is formed as the floating electrode layer 43 on the intermediate insulating layer 42. For example, a silicon oxide layer is formed as the tunneling insulating layer 44 on the floating electrode layer 43.

For example, the tunneling insulating layer (the silicon oxide layer) 44 is formed by CVD. Or, the tunneling insulating layer (the silicon oxide layer) 44 may be formed by thermal oxidation of a portion of the floating electrode layer (the polycrystalline silicon layer) 43.

For example, nitriding of the front surface of the tunneling insulating layer 44 is performed in a plasma atmosphere. The semiconductor layer 51 is formed on the tunneling insulating layer 44. The semiconductor layer 51 includes a p-type impurity and an n-type impurity. The method for forming the semiconductor layer 51 is described below in detail.

As shown in FIGS. 4A and 4B, the stacked body 100 that includes the insulating layer 11, the control electrode 20, the blocking insulating layer 30, the charge storage layer 41, the intermediate insulating layer 42, the floating electrode layer 43, the tunneling insulating layer 44, and the semiconductor layer 51 is formed on the substrate 10.

Subsequently, as shown in FIG. 5B, a second trench (a trench) 73 is made in the first stacked unit 60 including the charge storage layer 41, the intermediate insulating layer 42, the floating electrode layer 43, the tunneling insulating layer 44, and the semiconductor layer 51. For example, the trench 73 is made by RIE (Reactive Ion Etching) using a not-shown mask layer formed on the stacked body 100.

The trench 73 pierces the first stacked unit 60 and reaches the third blocking layer 33. The trench 73 divides the first stacked unit 60 in the Y-direction and extends into the page surface (the X-direction) in FIG. 5B.

Figure 6A:
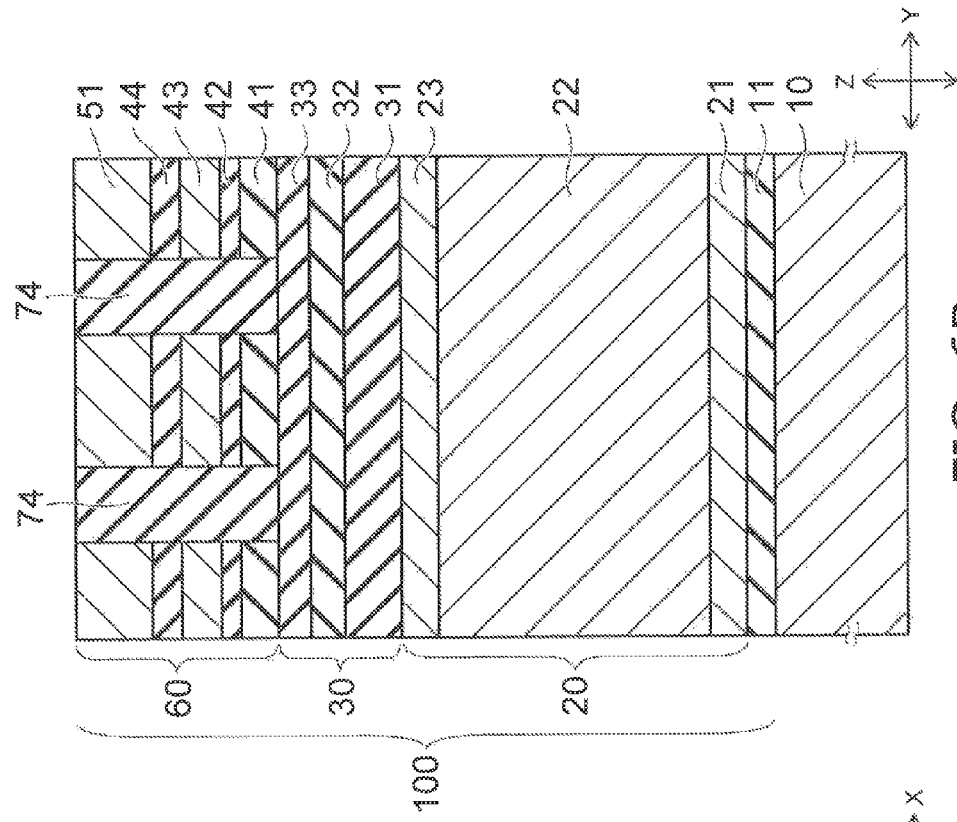
Figure 6B:
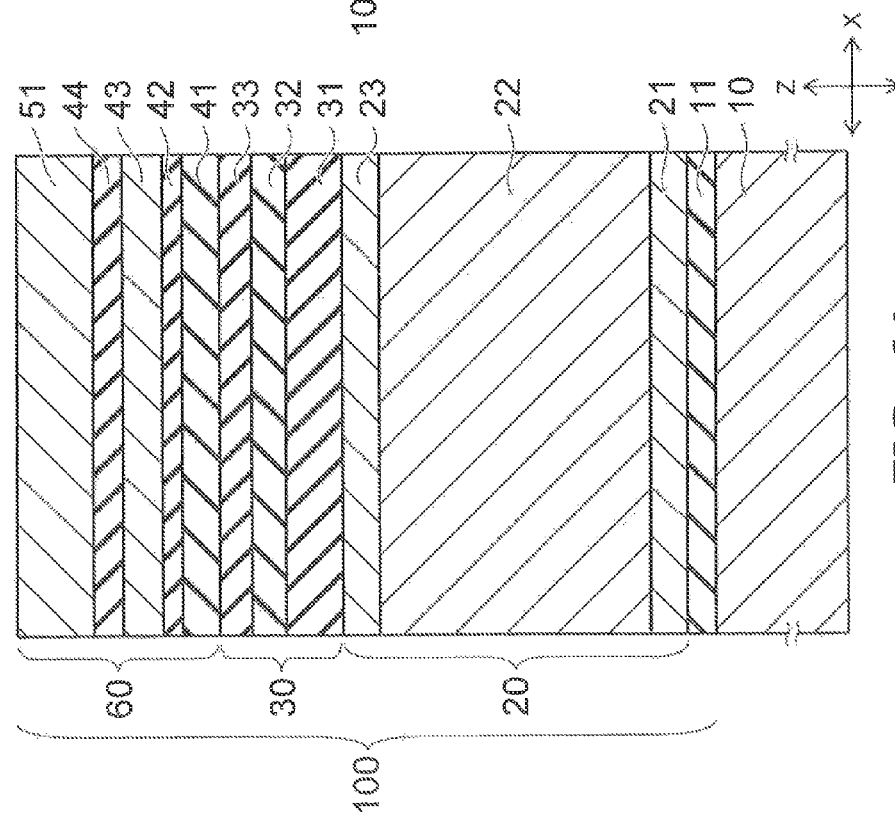

As shown in FIG. 6B, the second separation film 74 is formed inside the trench 73. For example, liquid polysilazane is coated inside the trench 73 and on the semiconductor layer 51; and curing by heat treatment is performed subsequently. After the curing, the second separation film 74 which is the cured body of polysilazane is planarized by, for example, CMP (Chemical Mechanical Polishing).

Then, as shown in FIG. 7A, a first trench (a trench) 71 is made in the stacked body 100. For example, the trench 71 is made by RIE using a not-shown mask layer formed on the stacked body 100.

The trench 71 pierces the stacked body 100 and reaches the substrate 10. The trench 71 divides the stacked body 100 in the X-direction and extends into the page surface (the Y-direction) in FIG. 7A. As shown in FIG. 2A, the first separation film 72 is formed inside the trench 71.

Subsequently, the interconnect layer 80 and the insulating layer 75 shown in FIGS. 2A and 2B are formed on the stacked body 100.

A semiconductor device of a comparative-example having a structure that is different from that of the semiconductor device of the embodiment will now be described.

FIGS. 14A and 14B are schematic cross-sectional views of the semiconductor device of the comparative example.

FIG. 14A corresponds to the cross section shown in FIG. 2A; and FIG. 14B corresponds to the cross section shown in FIG. 2B.

In the semiconductor device of the comparative example, a semiconductor layer 151 is provided on the substrate 10; a tunneling insulating layer 144 is provided on the semiconductor layer 151; a floating electrode layer 143 is provided on the tunneling insulating layer 144; an intermediate insulating layer 142 is provided on the floating electrode layer 143; a charge storage layer 141 is provided on the intermediate insulating layer 142; a blocking insulating layer 130 is provided on the charge storage layer 141; and a control electrode 120 is provided on the blocking insulating layer 130.

The blocking insulating layer 130 includes an aluminum oxide layer 133, a hafnium oxide layer 132 that is provided on the aluminum oxide layer 133, and a tantalum oxide layer 131 that is provided on the hafnium oxide layer 132.

The control electrode 120 includes a tungsten nitride layer 121 that is provided on the tantalum oxide layer 131, and a tungsten layer 122 that is provided on the tungsten nitride layer 121.

The stacking order of the layers, using the substrate 10 as a reference, of a stacked body 200 of the comparative example is the reverse of the stacking order of the layers, using the substrate 10 as a reference, of the stacked body 100 of the embodiment shown in FIGS. 2A and 2B.

As shown in FIG. 14A, a first separation film 172 is provided inside the stacked body 200. The first separation film 172 extends in the stacking direction (the Z-direction) of the stacked body 200 and reaches the semiconductor layer 151. The first separation film 172 extends into the page surface (the Y-direction) in FIG. 14A and separates the tunneling insulating layer 144, the floating electrode layer 143, the intermediate insulating layer 142, the charge storage layer 141, the blocking insulating layer 130, and the control electrode 120 in the X-direction.

In the semiconductor layer 151, an n-type semiconductor region 152 is formed under the first separation film 172. The region of the semiconductor layer 151 between the n-type semiconductor region 152 and the n-type semiconductor region 152 is a p-type semiconductor region (a channel region).

As shown in FIG. 14B, the semiconductor layer 151, the tunneling insulating layer 144, the floating electrode layer 143, the intermediate insulating layer 142, and the charge storage layer 141 are separated in the Y-direction by a trench T. A second separation film 174 and a portion of the aluminum oxide layer 133 are filled into the trench T.

The semiconductor layer 151, the tunneling insulating layer 144, the floating electrode layer 143, the intermediate insulating layer 142, and the charge storage layer 141 are separated in the X-direction and the Y-direction by the first separation film 172, the second separation film 174, and a portion of the aluminum oxide layer 133.

In the comparative example, the semiconductor layer 151, the tunneling insulating layer 144, the floating electrode layer 143, the intermediate insulating layer 142, and the charge storage layer 141 are formed on the substrate 10; and the trench T is made subsequently in the stacked unit of these layers. Then, the second separation film 174 is formed by filling liquid polysilazane into the trench T and by curing.

Subsequently, the aluminum oxide layer 133 is formed on the charge storage layer 141 and on the second separation film 174; and subsequently, the hafnium oxide layer 132, the tantalum oxide layer 131, the tungsten nitride layer 121, and the tungsten layer 122 are formed in order.

Figure 15:
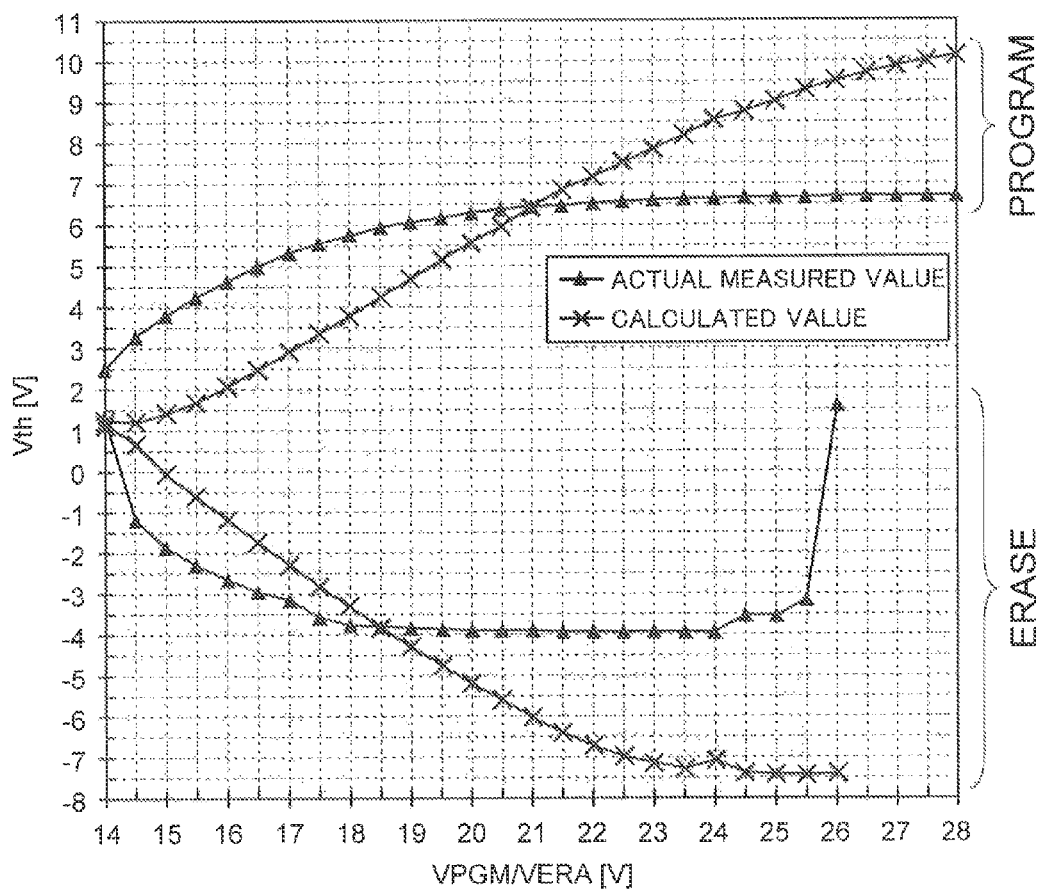
FIG. 15 is a figure of the programming and erasing characteristics of the semiconductor device of the comparative example.

FIG. 15 is a figure of the programming characteristics and the erasing characteristics of the semiconductor device of the comparative example.

The actual measured values and the calculated values from a simulation are shown.

The horizontal axis is a programming voltage VPGM (V) and an erasing voltage VERA (V). The vertical axis is a threshold voltage Vth (V).

The calculated programming saturation of the structure of the comparative example is about 10 V; and the calculated erasing saturation is about −7.5 V. However, the programming saturation of the actual measured values is about 7 V which is −3 V less than that of the calculated values; and the erasing saturation of the actual measured values is about −4 V which is −3.5 V less than that of the calculated values. Thus, compared to the calculated values, a drastic decrease of the threshold window occurred for the actual measured values.

Further, the ramp-up voltage of the actual measured values is shifted to the low voltage side compared to the calculated values for both programming and erasing; and this suggests fluctuation of the equivalent oxide thickness of the insulating film in the structure of the comparative example.

Verification of the cause revealed an abnormality of the aluminum oxide layer 133 of the blocking insulating layer 130.

Figure 16:
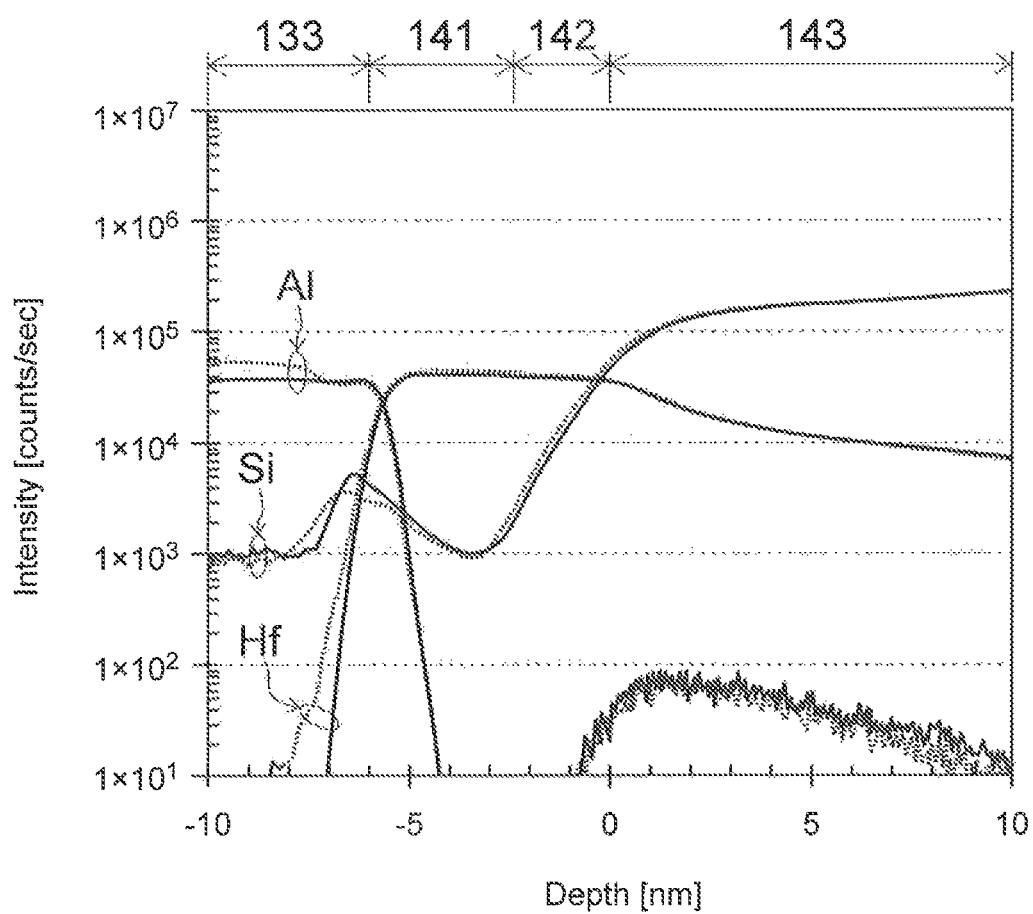
FIG. 16 is the depth-direction distribution diagram of Hf, Al, and Si concentration of the semiconductor device of the comparative example.

FIG. 16 is a depth-direction distribution diagram of hafnium (Hf), aluminum (Al), and silicon (Si) inside the aluminum oxide layer 133, the charge storage layer (the hafnium oxide layer) 141, the intermediate insulating layer (the silicon nitride layer) 142, and the floating electrode layer (the silicon layer) 143 by SIMS (Secondary Ion Mass Spectrometry) analysis.

The process of forming the aluminum oxide layer 133 includes processes of repeating a process of forming an aluminum film and a process of oxidizing the aluminum film using ozone or water. After the film formation of the aluminum oxide layer 133, heat treatment is performed to crystallize the aluminum oxide layer 133.

In FIG. 16, the solid lines illustrate the profiles directly after the film formation of the aluminum oxide layer 133; and the broken lines illustrate the profiles after performing heat treatment after the film formation of the aluminum oxide layer 133 for 10 seconds at 1035° C.

As illustrated by the solid lines, it can be seen that the aluminum oxide layer 133 absorbs Si after the film formation of the aluminum oxide layer 133. Further, as illustrated by the broken lines, it can be seen that the composition of the aluminum oxide layer 133 has undesirably changed after the heat treatment because the absorption of the Si into the aluminum oxide layer 133 has progressed from the state directly after the film formation, and Hf also is absorbed by the aluminum oxide layer 133 more than in the state after the film formation.

It is considered that the composition change of the aluminum oxide layer 133 causes the insulative properties of the aluminum oxide layer 133 to degrade, causes the electrons that should be stored in the charge storage layer 141 to leak via the aluminum oxide layer 133, and causes the stored charge amount of the charge storage layer 141 to decrease.

Also, it is considered that the aluminum oxide layer 133 becomes HfAlO due to the Hf of the charge storage layer 141 being absorbed by the aluminum oxide layer 133; and the EOT (equivalent oxide thickness) of the aluminum oxide layer 133 is reduced by the increase of the dielectric constant of HfAlO ($\in$=13 to 15) with respect to the dielectric constant of AlO ($\in$=9).

It is considered that the Si inside the polysilazane is absorbed by the aluminum oxide layer 133 from the contact location between the second separation film (the polysilazane) 174 and the aluminum oxide layer 133 shown in FIG. 14B.

Even though the polysilazane including Si has undergone sufficient heat treatment and is sufficiently cured, it is considered that the oxidizing agent in the film formation of the aluminum oxide layer 133 absorbs Si; and the Si is diffused inside the aluminum oxide layer 133 by the heat treatment after the film formation for crystallizing the aluminum oxide layer 133.

Therefore, as shown in FIG. 3B in the embodiment described above, the process of forming the third blocking layer 33 which is an aluminum oxide layer and the heat treatment after the film formation are performed in a state of not contacting a film including silicon.

Figure 8:
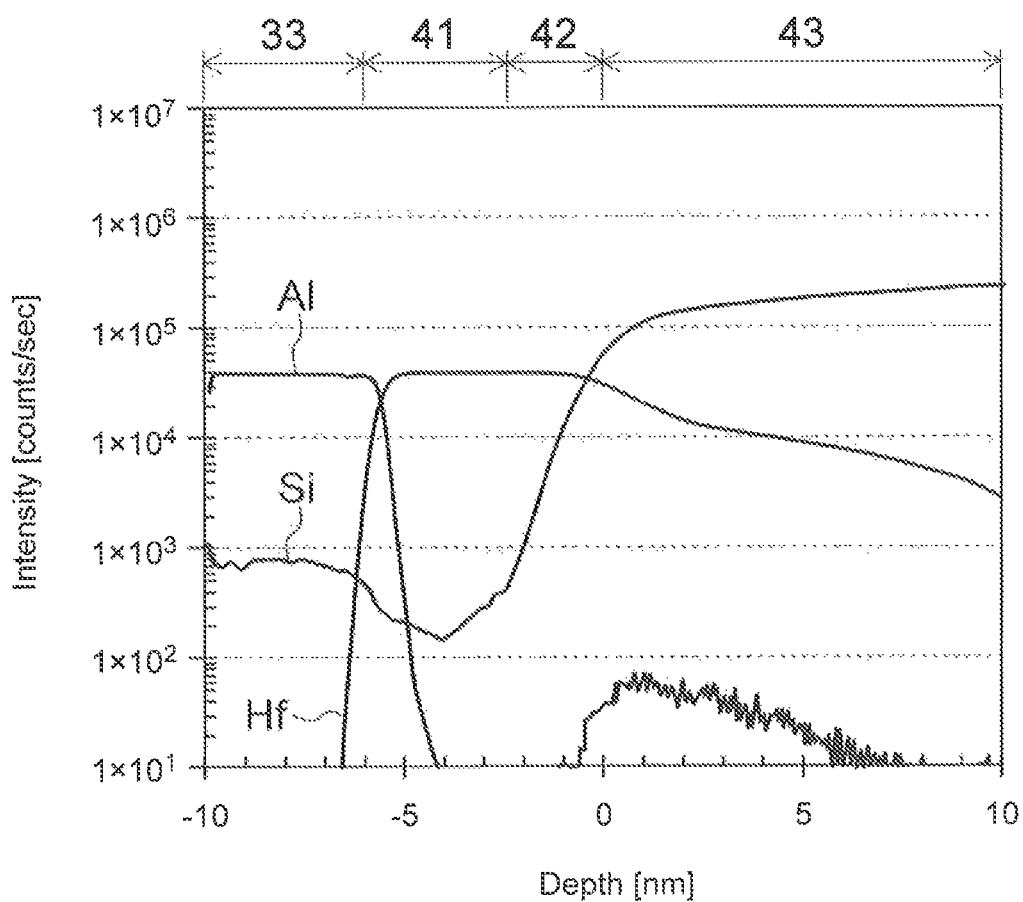
FIG. 8 is a depth-direction distribution diagram of Hf, Al, and Si concentration of the semiconductor device of the embodiment.

FIG. 8 is a depth-direction distribution diagram of hafnium (Hf), aluminum (Al), and silicon (Si) inside the third blocking layer (the aluminum oxide layer) 33, the charge storage layer (the hafnium oxide layer) 41, the intermediate insulating layer (the silicon nitride layer) 42, and the floating electrode layer (the silicon layer) 43 by SIMS analysis.

It can be seen that the Si concentration inside the third blocking layer (the aluminum oxide layer) 33 of the embodiment is low compared to the Si concentration inside the aluminum oxide layer 133 of the comparative example shown in FIG. 16, and there is substantially no mixing between the third blocking layer (the aluminum oxide layer) 33 of the embodiment and the films including Si.

In the embodiment, compared to the comparative example, the Hf concentration inside the third blocking layer (the aluminum oxide layer) 33 is low. Therefore, conversely, it is considered that the aluminum oxide layer 133 of the comparative example simultaneously absorbs Hf when absorbing Si.

The profiles in FIG. 16 of the comparative example suggest that the charge storage layer (the hafnium oxide layer) 141 of the comparative example shown in FIG. 14B also absorbs the Si from the second separation film 174, and the charge storage layer 141 becomes HfSiO.

It is known that Si addition to HfO increases the charge storage sites and increases the storage capacity; and the Si absorption inside the HfO is not a problem when used as a charge storage layer. However, it is considered that the Hf from the charge storage layer 141 where the HfSiO is produced is absorbed simultaneously when the aluminum oxide layer 133 absorbs the Si. This may cause fluctuation of the dielectric constant and/or insulation stability of the aluminum oxide layer 133.

Conversely, according to the embodiment as shown in FIG. 3B, the blocking insulating layer 30 is cured and crystallized by heat treatment after the blocking insulating layer 30 is formed and prior to forming the charge storage layer 41. Or, as shown in FIG. 4B, the blocking insulating layer 30 may be cured and crystallized by heat treatment after the formation up to the semiconductor layer 51. The heat treatment of the blocking insulating layer 30 may be performed at any point in time after the blocking insulating layer 30 is formed up to the formation of the second separation film 74 shown in FIG. 6B.

In any case, the blocking insulating layer 30 undergoes heat treatment and curing in a state of not contacting the second separation film 74 including silicon. The charge storage layer 41 which is a hafnium oxide layer also is cured and crystallized by heat treatment prior to forming the second separation film 74. The charge storage layer 41 also is cured in a state of not contacting the second separation film 74 including silicon. Accordingly, the charge storage layer 41 absorbs silicon; but HfSiO substantially is not produced.

In the embodiment shown in FIG. 8, compared to the comparative example shown in FIG. 16, the Si concentration is lower not only inside the third blocking layer (the aluminum oxide layer) 33 but also inside the charge storage layer 41.

Thus, in the embodiment, the blocking insulating layer 30 that has the desired dielectric constant and insulation stability can be formed to have Si absorption and mixing with the charge storage layer 41 that are as low as possible. Such a blocking insulating layer 30 of the embodiment has high blocking properties for the leaking of the charge from the charge storage layer 41 and provides high reliability of operations such as programming and/or erasing of the memory cells MC, etc.

In the embodiment, the semiconductor layer 51 which is a silicon layer includes an n-type impurity as a supply source of free electrons and a p-type impurity as a supply source of holes. The semiconductor layer 51 includes, for example, phosphorus (P) as the n-type impurity and boron (B) as the p-type impurity. Or, arsenic (As) may be included as the n-type impurity.

Figure 9:
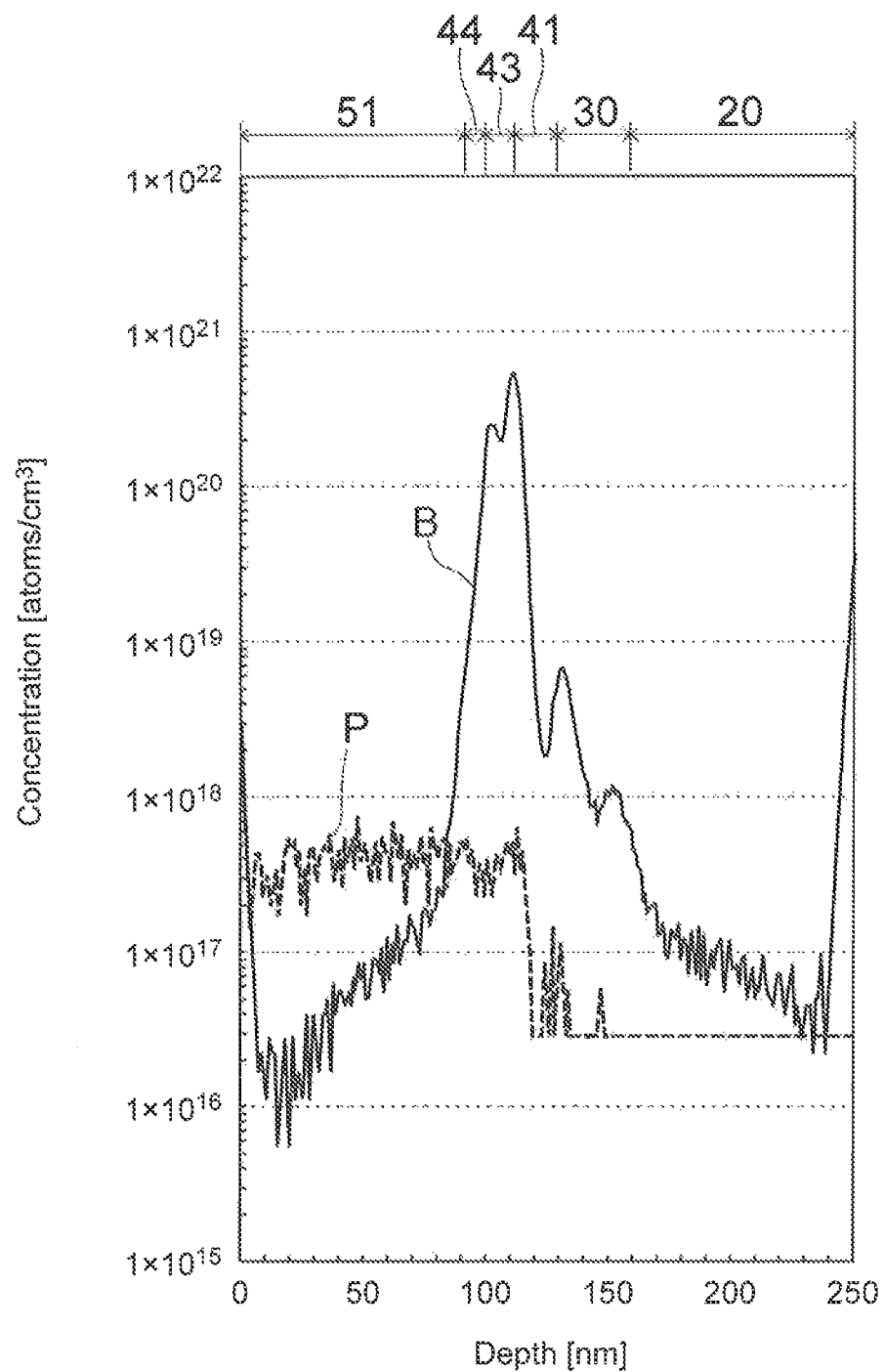
FIG. 9 is an impurity concentration profiles for one portion of the semiconductor device of the embodiment.

FIG. 9 is a distribution diagram of the phosphorus (P) concentration and the boron (B) concentration measured by SIMS for one portion of the semiconductor device of the embodiment.

Compared to the boron concentration, the phosphorus concentration is substantially constant within the range from $1 \times 10^{17}$ (atom/cm$^3$) to $1 \times 10^{18}$ (atom/cm$^3$) from the tunneling insulating layer 44 to the front surface side of the semiconductor layer 51.

On the other hand, the boron concentration is high on the side of the interface between the semiconductor layer 51 and the tunneling insulating layer 44, becomes lower than the phosphorus concentration at a position inside the semiconductor layer 51 about 20 nm away from the interface, and decreases toward the front surface side of the semiconductor layer 51.

The boron concentration inside the semiconductor layer 51 has a peak on the tunneling insulating layer 44 side of the center position in the thickness direction of the semiconductor layer 51. The boron concentration is higher than the phosphorus concentration on the tunneling insulating layer 44 side of the center position in the thickness direction of the semiconductor layer 51; and the boron concentration is lower than the phosphorus concentration on the semiconductor layer 51 front surface side of the center position in the thickness direction of the semiconductor layer 51.

Such impurity concentration profiles inside the semiconductor layer 51 are obtained by the following process.

The process of forming the semiconductor layer 51 includes the process of forming a boron layer as a p-type impurity layer on the tunneling insulating layer 44 and the process of forming a silicon layer including phosphorus as an n-type impurity on the boron layer.

For example, a boron layer of about 3 angstroms is formed on the front surface of the tunneling insulating layer 44 by ALD (Atomic Layer Deposition). Subsequently, for example, a phosphorous-doped silicon layer is formed on the boron layer in a gas atmosphere including PH$_3$. The thickness of the entire semiconductor layer 51 is 1000 angstroms, of which 3 angstroms on the tunneling insulating layer 44 side is the boron layer. Boron is segregated to the vicinity of the interface between the semiconductor layer 51 and the tunneling insulating layer 44. After the film formation of the boron layer and the phosphorous-doped silicon layer, heat treatment is performed; and the impurity concentration profiles shown in FIG. 9 are obtained.

Measurement results of cell characteristics for four cases of impurity profiles inside the semiconductor layer 51 will now be described. For each of the four cases, the semiconductor layer 51 is a silicon layer; and the thickness of the semiconductor layer 51 is 100 nm (1000 angstroms).

In case 1, the semiconductor layer 51 is non-doped and substantially includes only the intrinsic carrier.

In case 2, the semiconductor layer 51 includes boron having a low concentration ($1 \times 10^9$ cm$^{-3}$ or less) as the p-type impurity and does not include an n-type impurity.

In case 3, the semiconductor layer 51 includes phosphorus having a low concentration ($1 \times 10^{18}$ cm$^{-3}$ or less) as the n-type impurity. Further, a dose of $5 \times 10^{13}$ cm$^{-2}$ of boron was implanted by ion implantation at 2 keV into the phosphorous-doped silicon layer; and subsequently, heat treatment was performed for 30 seconds at 950° C. A p-type layer is formed on the front surface side of the semiconductor layer 51 which is the phosphorous-doped silicon layer on the side opposite to the tunneling insulating layer 44.

In case 4, the semiconductor layer 51 having the impurity concentration profile shown in FIG. 9 described above was formed by forming a boron layer of about 3 angstroms on the front surface of the tunneling insulating layer 44, and subsequently forming a phosphorous-doped silicon layer having a low concentration (not more than $1 \times 10^{18}$ cm$^{-3}$) on the boron layer.

FIG. 10A, FIG. 11A, FIG. 12A, and FIG. 13A respectively show the CV (cyclic voltammetry) measurement results for cases 1 to 4. The CV characteristics of multiple chips are measured for each of cases 1 to 4.

In FIG. 10A, FIG. 11A, FIG. 12A, and FIG. 13A, the horizontal axis is a potential Vsub (V) of the substrate 10 or a potential Vg (V) of the control electrode 20; and the vertical axis is a capacitance C (F) of one memory cell MC.

FIG. 10B, FIG. 11B, FIG. 12B, and FIG. 13B respectively are figures of the programming characteristics and the erasing characteristics for cases 1 to 4. The actual measured values and the calculated values from simulations are shown.

In FIG. 10B, FIG. 11B, FIG. 12B, and FIG. 13B, the horizontal axis is the programming voltage VPGM (V) and the erasing voltage VERA (V). The vertical axis is the threshold voltage Vth (V).

Figure 10A:
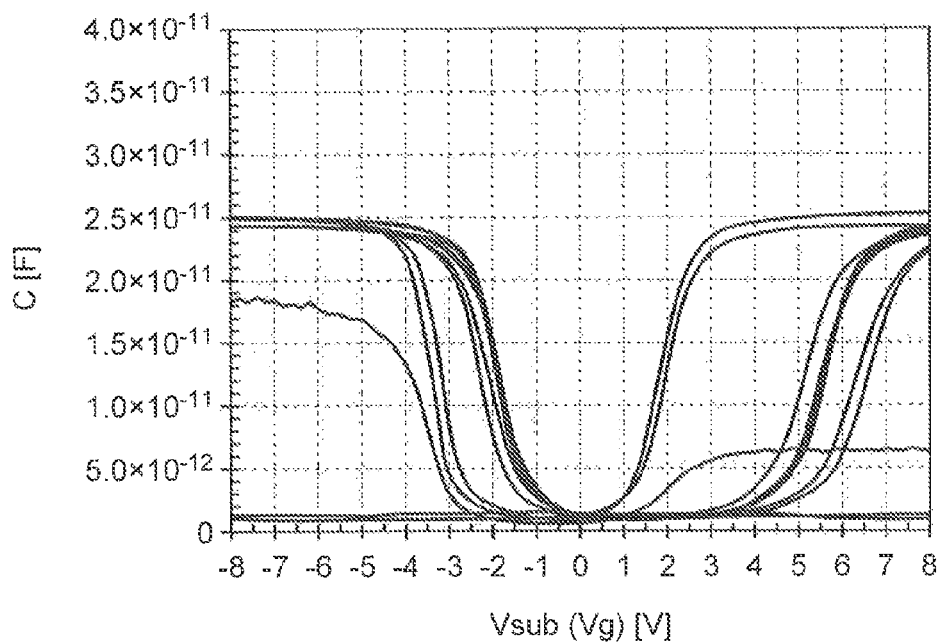
FIG. 10A is a figure of a CV characteristics.
Figure 10B:
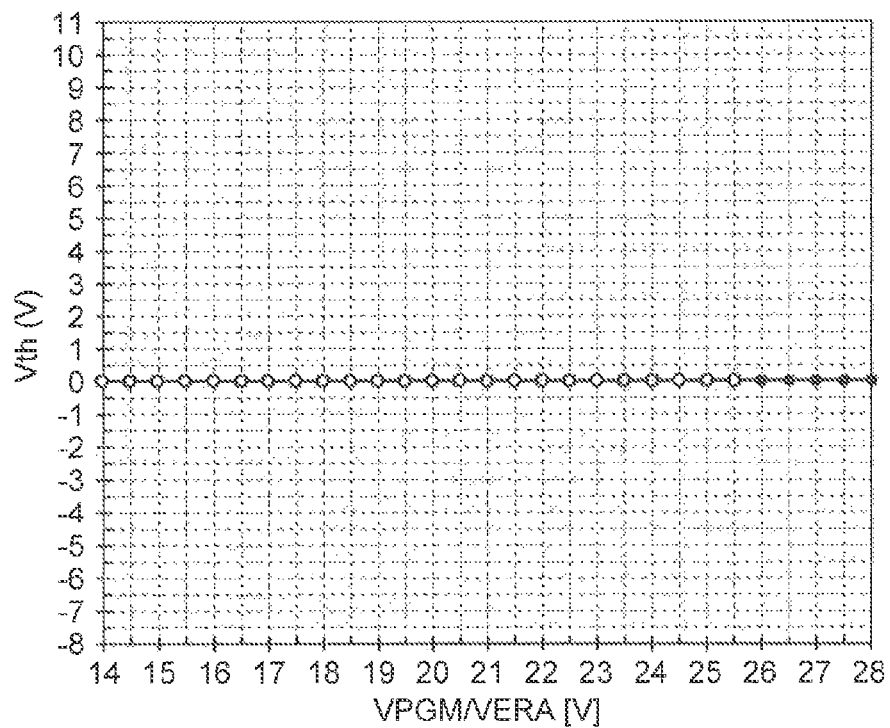
FIG. 10B is a figure of a programming and erasing characteristics.

In case 1, the fluctuation of the CV capacitance between the chips is pronounced as shown in FIG. 10A; and the programming and erasing operations cannot be performed as shown in FIG. 10B.

Figure 11A:
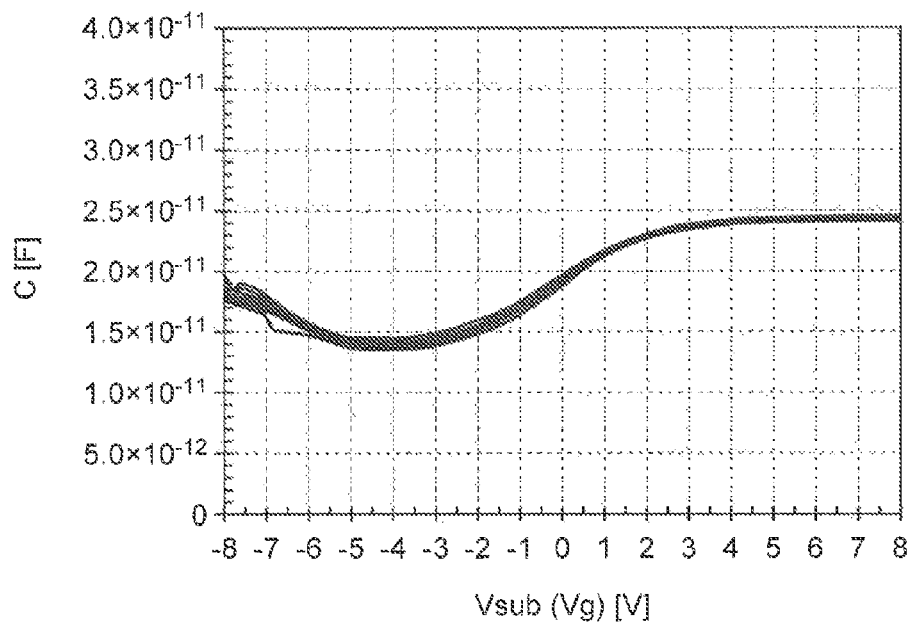
FIG. 11A is a figure of the CV characteristics.
Figure 11B:
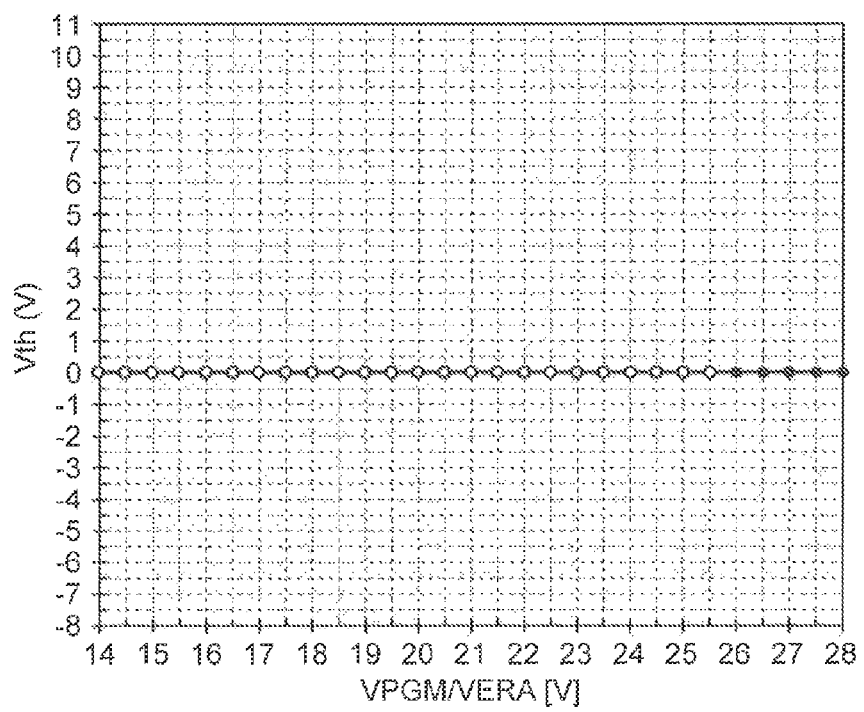
FIG. 11B is a figure of the programming and erasing characteristics.

In case 2, the storage capacitance is measurable but the inversion capacitance after the depletion is not obtained as shown in FIG. 11A; and the programming and erasing operations cannot be performed as shown in FIG. 11B.

Figure 12A:
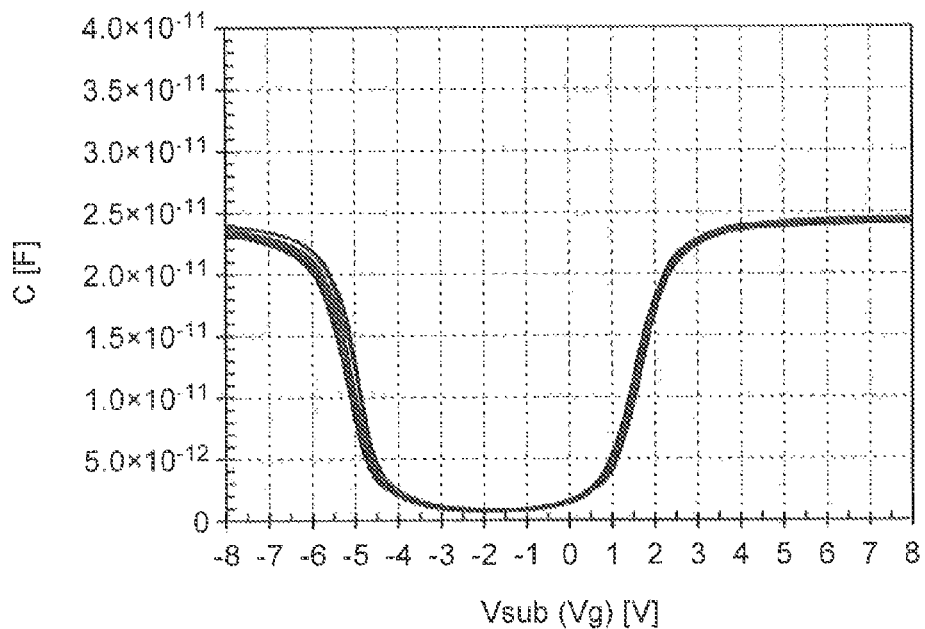
FIG. 12A is a figure of the CV characteristics.
Figure 12B:
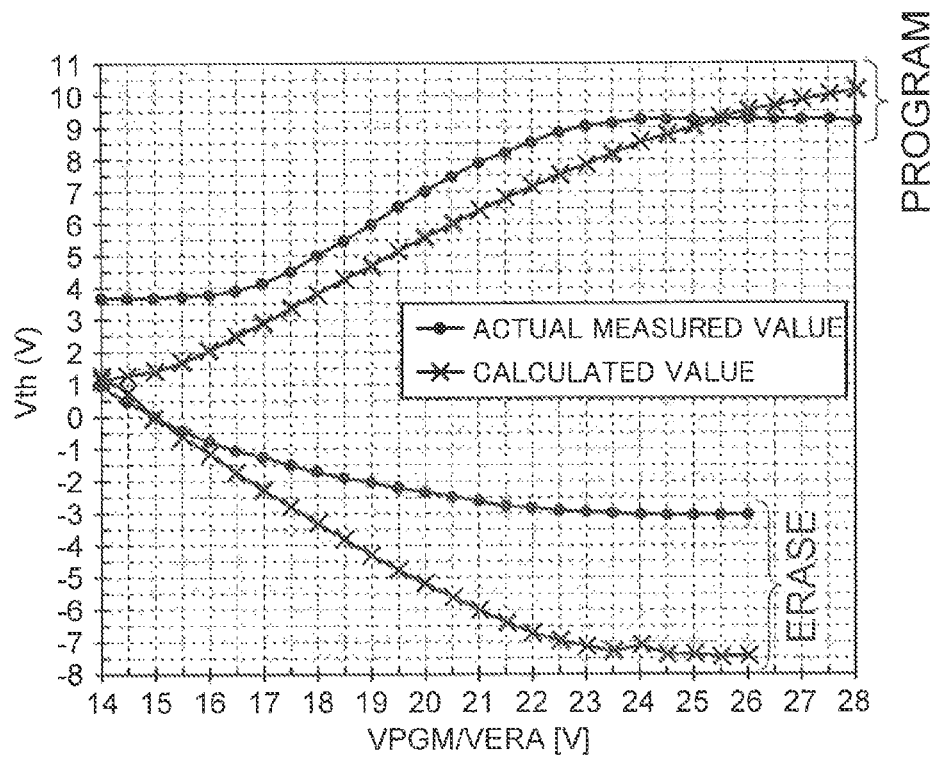
FIG. 12B is a figure of the programming and erasing characteristics.

In case 3, according to the CV waveform shown in FIG. 12A, while charge storage, depletion, and inversion capacitance can be seen, the inversion voltage is in a high state. Also, as shown in FIG. 12B, the programming and erasing operations are possible. Although the actual measured values obtained at programming saturation are values near the calculated values, the actual measured values do not expand at erasing saturation; and the erasing operation substantially cannot be performed.

In case 3, while the electrons necessary for programming are supplied to the charge storage layer 41 by the low-concentration phosphorus inside the semiconductor layer 51, it is considered that the hole supply to the charge storage layer 41 is insufficient in the p-type layer formed by ion implantation of the semiconductor layer 51 front surface side.

Generally, it is known that the mobility of holes is slower than the mobility of electrons. It is considered that when a negative voltage is applied to the control electrode 20 and the holes on the semiconductor layer 51 front surface side are caused to move toward the tunneling insulating layer 44 side, the holes scatter in the semiconductor layer 51; and there is a possibility that the holes and the electrons supplied by the phosphorus inside the semiconductor layer 51 may recombine and disappear.

Figure 13A:
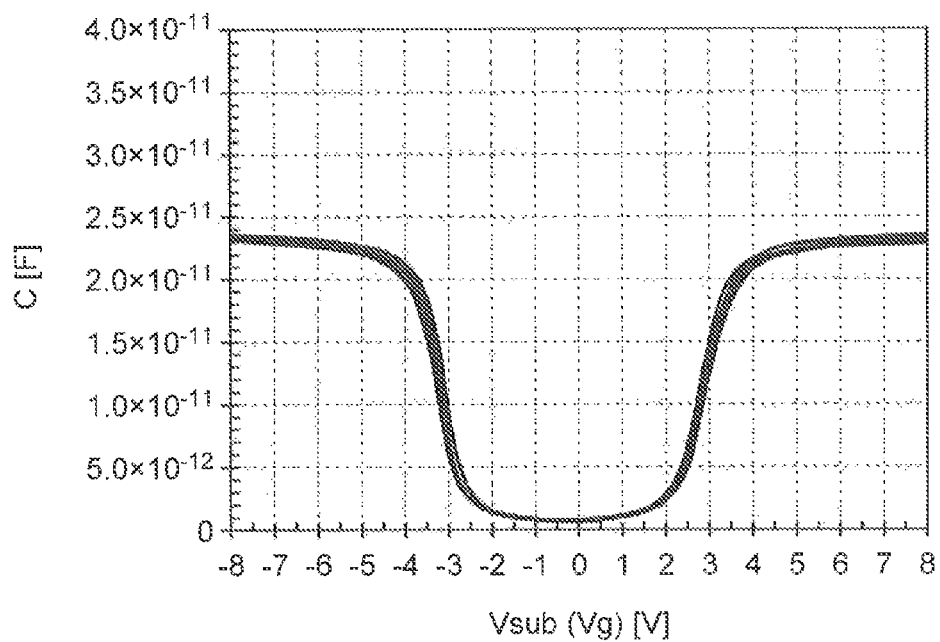
FIG. 13A is a figure of the CV characteristics.
Figure 13B:
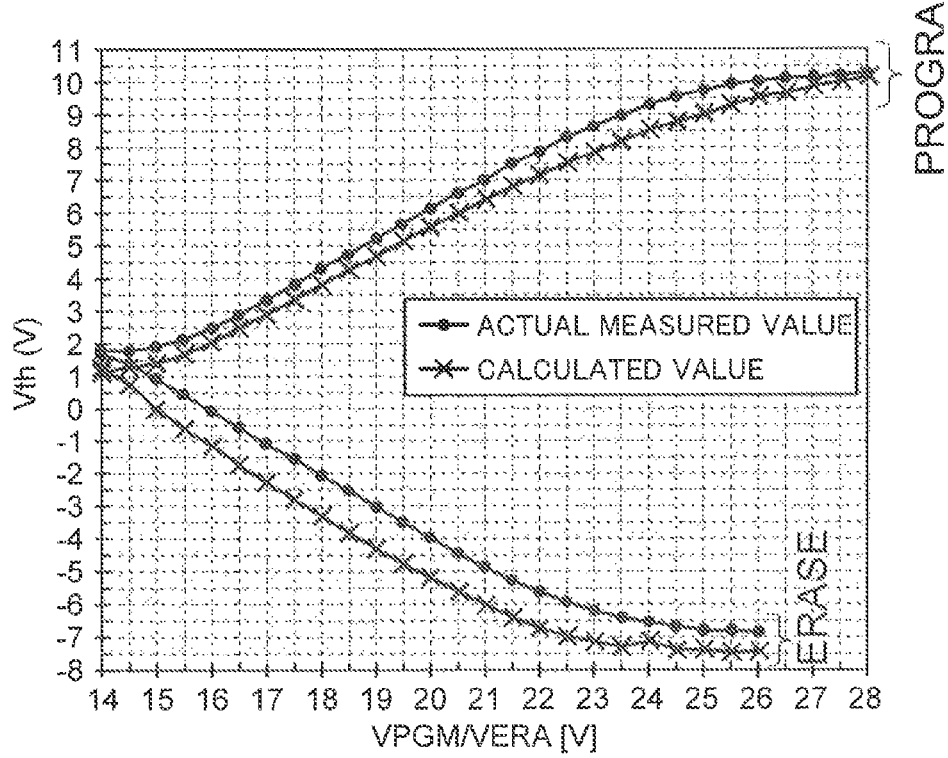
FIG. 13B is a figure of the programming and erasing characteristics.

In case 4, according to the CV waveform shown in FIG. 13A, while charge storage, depletion, and inversion capacitance can be seen, there is no apparent extreme fluctuation of the storage voltage and the inversion voltage. Also, as shown in FIG. 13B, the actual measured values of the programming and erasing characteristics that are obtained have characteristics equivalent to those of the calculated values; and the programming and erasing operations can be performed normally.

In case 4, because the holes exist at a high concentration on the tunneling insulating layer 44 side as shown in FIG. 9, it is considered that the holes are supplied quickly to the charge storage layer 41, or recombination with the electrons supplied by the phosphorus does not occur easily.

In case 4, because boron is segregated inside the semiconductor layer 51 at the vicinity of the interface with the tunneling insulating layer 44, the electron supply by the low-concentration phosphorus and the hole supply by the boron are possible; and normal programming and erasing characteristics are obtained.

In a method for implanting the boron into the vicinity of the interface between the semiconductor layer 51 and the tunneling insulating layer 44 by ion implantation, there is a concern that the boron may diffuse into the tunneling insulating layer 44 and into the layers under the tunneling insulating layer 44 due to the heat treatment after the implantation; and the cell characteristics may undesirably fluctuate. As described above, in the method for forming the phosphorous-doped silicon layer after forming the extremely thin boron layer of about 3 angstroms, the impurity concentration or carrier concentration profile of FIG. 9 that cannot be realized by ion implantation can be realized. This makes the appropriate programming and erasing operations possible.

Here, in the case where the phosphorus concentration inside the semiconductor layer 51 was increased to $1 \times 10^{19}$ (atom/cm$^3$) or more and in the case where the film thickness of the p-type impurity layer (the boron layer) formed on the tunneling insulating layer 44 was set to be 3 nm or more, an inversion operation similarly to that of case 2 could not be obtained for either case; and the programming and erasing operations could not be performed. Accordingly, it is desirable for the phosphorus concentration inside the semiconductor layer 51 to be $1 \times 10^{18}$ (atom/cm$^3$) or less, and for the thickness of the p-type impurity layer (the boron layer) formed on the tunneling insulating layer 44 to be less than 3 nm.

Although an aluminum oxide layer is illustrated as an example of the blocking layer contacting the polysilazane which includes silicon, the silicon is easily absorbed also by a hafnium oxide layer, a zirconium oxide layer, a lanthanum oxide layer, or a tantalum oxide layer when forming and curing such a layer. Therefore, phenomena similar to those of the comparative example may occur if such metal oxide layers are formed and undergo curing in a state of contacting a film including silicon.

Accordingly, the embodiment is effective in that the fluctuation of the insulation stability and the dielectric constant is suppressed in the case where the blocking layer includes a metal oxide layer such as an aluminum oxide layer, a hafnium oxide layer, a zirconium oxide layer, a lanthanum oxide layer, a tantalum oxide layer, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a control electrode extending a first direction;
   a first insulating layer provided on the control electrode, the first insulating layer containing a metal oxide;
   a charge storage layer provided on the first insulating layer;
   an intermediate insulating layer provided on the charge storage layer;
   a floating electrode layer provided on the intermediate insulating layer;
   a second insulating layer provided on the floating electrode layer;
   a semiconductor layer provided on the second insulating layer;
   a first separation film separating the control electrode, the first insulating layer, the charge storage layer, the intermediate insulating layer, the floating electrode layer, and the second insulating layer in the first direction; and
   a second separation film separating a first stacked unit in a second direction, the first stacked unit including the charge storage layer, the intermediate insulating layer, the floating electrode layer, the second insulating layer, and the semiconductor layer, the second direction intersecting the first direction, the second separation film containing silicon,
   the semiconductor layer containing an n-type impurity and a p-type impurity, and
   a concentration of the p-type impurity having a peak on the second insulating layer side of a center position in a thickness direction of the semiconductor layer.

2. The device according to claim 1, further comprising an interconnect layer provided on the semiconductor layer and on the first separation film, the interconnect layer contacting the semiconductor layer and extending in the first direction.

3. The device according to claim 2, wherein the interconnect layer is a silicon layer.

4. The device according to claim 1, wherein a dielectric constant of the first insulating layer is 9 or more.

5. The device according to claim 1, wherein the first insulating layer contains at least one of aluminum, hafnium, tantalum, zirconium, and lanthanum.

6. The device according to claim 1, wherein the semiconductor layer is a silicon layer.

7. The device according to claim 6, wherein the n-type impurity is phosphorus, and the p-type impurity is boron.

8. The device according to claim 7, wherein a concentration of the n-type impurity is not more than $1\times10^{18}$ (atom/cm$^3$).

9. The device according to claim 1, further comprising a substrate and a third insulating layer provided between the substrate and the control electrode.

10. The device according to claim 1, wherein the charge storage layer contains a metal oxide.

11. The device according to claim 1, wherein the control electrode includes a first metal nitride layer, a second metal nitride layer, and a metal layer provided between the first metal nitride layer and the second metal nitride layer.

12. The device according to claim 1, wherein
   the intermediate insulating layer is a silicon nitride layer,
   the floating electrode layer is a silicon layer, and
   the second insulating layer is a silicon oxide layer.

13. A semiconductor device, comprising:
   a control electrode extending a first direction;
   a first insulating layer provided on the control electrode, the first insulating layer containing a metal oxide;
   a charge storage layer provided on the first insulating layer;
   an intermediate insulating layer provided on the charge storage layer;
   a floating electrode layer provided on the intermediate insulating layer;
   a second insulating layer provided on the floating electrode layer;
   a semiconductor layer provided on the second insulating layer;
   a first separation film separating the control electrode, the first insulating layer, the charge storage layer, the intermediate insulating layer, the floating electrode layer, and the second insulating layer in the first direction; and
   a second separation film separating a first stacked unit in a second direction, the first stacked unit including the charge storage layer, the intermediate insulating layer, the floating electrode layer, the second insulating layer, and the semiconductor layer, the second direction intersecting the first direction, the second separation film containing silicon,
   the semiconductor layer containing an n-type impurity and a p-type impurity,
   a concentration of the p-type impurity being higher than a concentration of the n-type impurity on the second insulating layer side of a center position in a thickness direction of the semiconductor layer, and
   the concentration of the p-side impurity being lower than the concentration of the n-type impurity on the semiconductor layer front surface side of the center position in the thickness direction of the semiconductor layer.

14. The device according to claim 13, further comprising an interconnect layer provided on the semiconductor layer and on the first separation film, the interconnect layer contacting the semiconductor layer and extending in the first direction.

15. The device according to claim 13, wherein the first insulating layer contains at least one of aluminum, hafnium, tantalum, zirconium, and lanthanum.

16. The device according to claim 13, wherein
   the semiconductor layer is a silicon layer,
   the n-type impurity is phosphorus, and the p-type impurity is boron, and
   a concentration of the n-type impurity is not more than $1\times10^{18}$ (atom/cm$^3$).

17. The device according to claim 13, further comprising a substrate and a third insulating layer provided between the substrate and the control electrode,
   wherein the charge storage layer contains a metal oxide, and
   the control electrode includes a first metal nitride layer, a second metal nitride layer, and a metal layer provided between the first metal nitride layer and the second metal nitride layer.

* * * * *